United States Patent [19]
Park

[11] Patent Number: 5,272,706
[45] Date of Patent: Dec. 21, 1993

[54] STATE METRIC MEMORY

[75] Inventor: Il-geun Park, Suwon, Rep. of Korea

[73] Assignee: Samsung Electronics Co., Ltd., Kyunggi, Rep. of Korea

[21] Appl. No.: 723,192

[22] Filed: Jun. 28, 1991

[30] Foreign Application Priority Data

Dec. 17, 1990 [KR] Rep. of Korea .................. 90-20808

[51] Int. Cl.$^5$ ............................................. G06F 11/10
[52] U.S. Cl. ................................................. 371/43
[58] Field of Search ............... 371/43, 44, 45; 375/39, 375/94, 14, 18, 96

[56] References Cited

U.S. PATENT DOCUMENTS

| | | | |
|---|---|---|---|
| 4,484,338 | 11/1984 | Clark et al. | 375/94 |
| 4,606,027 | 8/1986 | Otani | 371/43 |
| 4,797,887 | 1/1989 | Yamasaki et al. | 371/43 |
| 4,885,757 | 12/1989 | Provence | 375/96 |
| 4,905,317 | 2/1990 | Suzuki et al. | 341/51 |
| 4,979,175 | 12/1990 | Porter | 371/43 |
| 5,081,651 | 1/1992 | Kubo | 375/94 |

Primary Examiner—Charles E. Atkinson
Attorney, Agent, or Firm—Rothwell, Figg, Ernst & Kurz

[57] ABSTRACT

A state metric quantity memory which enhances processing speed by reconstructing the state metric quantity memory employed in a viterbi decoder for correcting errors created in a digital transmission channel, includes first delay means for storing a previous state metric quantity, second delay means for storing the current state metric quantity, first switching means which operates to make the first delay means store the current state metric quantity, second switching means which operates to make the second delay means store the previous state metric quantities, third switching means connecting the output signals of the first and second delay means to the input terminal of the add compare selector, and fourth switching means for sequentially supplying a clock signal having a basic period so that the first and second delay means store each state metric quantity, thereby reducing delay time of input data and enhancing data processing speed.

4 Claims, 5 Drawing Sheets

STATE METRIC MEMORY

BACKGROUND OF THE INVENTION

The present invention relates to a state metric memory, and more particularly to an apparatus which increases processing speed by reconstructing the state metric memory employed in a viterbi decoder for correcting errors created in a digital transmission channel.

The viterbi decoder is an apparatus for decoding data that is encoded in convolutional code by employing a maximum likelihood decoding method with viterbi algorithm. The viterbi decoder compares the code sequence of received data with a predetermined code sequence of the encoder to select the nearest path of the code sequence and decode the code transmitted from the selected path. Among the various methods for decoding a convolutional code, a decoder adopting the viterbi method is used due to its significant decoding benefit in communications systems where the quality of transmission path deteriorates or the transmitted signal levels are severely limited.

As illustrated in FIG. 1, a conventional viterbi decoder comprises an input buffer 100, a branch metric calculator 200, an add compare selector 300, a state metric memory 400, a path trace-back logic circuit 500, a path memory 600, and a main clock generator 700.

Generally, input buffer 100, connected between a receiver (not shown) and a decoder, transmits data received from input terminal IN to branch metric quantity calculator 200 which compares the data from the encoder and the received data to output a neighboring value to them. Add compare selector 300 adds the branch metric quantity calculated in branch metric quantity calculator 200 to the metric quantity of a previous state stored in state metric quantity memory 400, and compares the added metric quantity with the previous metric quantity to output a state metric quantity Sm having a path sequence nearest to the transmitted code sequence. The state metric quantity Sm added in the add compare selector 300 is stored again in state metric memory quantity 400, the selected paths are stored in path memory 600 through path trace-back logic circuit 500. Path trace back logic circuit 500 traces path information stored in path memory 600, and outputs to output terminal OUT data that is nearest to the transmitted data of a transmitter.

At this time, main clock generator 700 receives an input clock signal CLOCK to transmit a main clock signal MAIN CLOCK to each unit.

The add compare selector 300 and state metric quantity memory 400 adopted in the viterbi encoder as described above are depicted in detail in FIG. 2. Adders 310 and 320 constituting the add compare selector 300 add branch metric quantities Bmi, Bm(i+1) transmitted from branch metric quantity calculator 200 and the previous state metric quantities Sm(a) and Sm(b) transmitted from state metric quantity memory device 410 of state metric quantity memory 400 so as to transmit output signals to comparator 330 and selector 340. The comparator 330 receives and compares the signals generated from each adder 310 and 320, and the resultant signals generated after comparison are transmitted to selector 340.

Receiving the compared signals from comparator 330, selector 340 selects a signal having a smaller state metric quantity from among the signals transmitted from adders 310 and 320 to set a new state metric quantity Sm(c) and stores it in state metric quantity memory 400. Memory location designator 420 then transmits an address to state metric quantity memory device 410 to designate a memory location.

To explain the operation of the viterbi decoder, a trellis diagram of decoding a signal encoded in convolutional code of code ratio $R=\frac{1}{2}$ and constraint length $K=3$ is shown in FIG. 3, which is repeated according to the variations of decode time point j. As the total number of states of the state metric quantities Sm supplied from branch metric quantity calculator 200 becomes $2^{k-1}$, the total number of states when the constraint length K is 3 as shown in FIG. 3 becomes 4. At this time, if the present time point is j+1, the calculation of each state is represented by the below equations 1 to 4.

$$Sm_{(j+1)}0 = MIN[Smj0+Bm0, Smj1+Bm1] \quad <\text{equation 1}>$$

$$Sm_{(j+1)}1 = MIN[Smj2+Bm2, Smj3+Bm3] \quad <\text{equation 2}>$$

$$Sm_{(j+1)}2 = MIN[Smj0+Bm1, Smj1+Bm0] \quad <\text{equation 3}>$$

$$Sm_{(j+1)}3 = MIN[Smj2+Bm3, Smj3+Bm2] \quad <\text{equation 4}>$$

As expressed in the above equations 1 to 4, calculating all state metric quantities Sm of current decode time point (j+1) and a double reading of the state metric quantity for decode time point j of former state must be carried out in order to store the state metric quantities in memory device 410. As a result, memory location designator 420 shown in FIG. 2 is required to designate a different location during each period of read-out and write-in of the memory address of state metric quantity memory device 410.

Meanwhile, the decode processing speed which usually depends on the state metric quantity calculating speed takes much more time to read and write each state metric quantity Sm in state memory 400 than the time required for calculating in the add compare selector 300 so that the processing speed is limited. The reason for this is that, in case of add compare selector 300, only the processing in a logic circuit is delayed, but in case of state metric quantity memory 400, the designation of the memory locations for read-out and write-in operation of the add compare selector 300 should be carried out in such a manner as expressed in Equations 1 to 4, resulting in much delay time and requiring access time to write-in and read-out data in the state metric quantity memory device 410. Thus, in order to have high speed access time for high speed data decode processing, the add compare selector 300 and the state metric quantity memory 400 composed of a memory location designator 420 and a state metric quantity memory device 410 are connected to each other in parallel to be used for calculation at the same time. Thus, the veterbi decoder using the above described methods has the disadvantages of high production cost and complex circuitry.

SUMMARY OF THE INVENTION

Therefore, it is an object of the present invention to provide a state metric quantity memory which minimizes access time and processes data at a high speed without a memory location designator.

To attain the object of the present invention, there is provided a state metric quantity memory in a viterbi decoder including an input buffer, a branch metric quantity calculator, an add compare selector, a path trace-back logic circuit, a state metric quantity memory, a path memory and a main clock generator, said state metric quantity memory comprising first and second delay circuits for memorizing a previous state of the state metric quantity transmitted from the add compare selector: third and fourth delay circuits for memorizing the current state metric quantity transmitted from the add compare selector; first and second switches which operate to make the first and second delay circuits store the current state metric quantity at the time point when the next data is input; third and fourth switches which operate to make the third and fourth delay circuits store the previous state metric quantity at the time point when the next data input; fifth and sixth switches for connecting the output signals of the first, second, third and fourth delay circuits used as a previous state metric quantities to the input terminal of the add compare selector according to the time point variation; and seventh, eighth, ninth and tenth switches for sequentially supplying a basic period clock signal to the first, second, third and fourth delay circuits so as to store each state metric quantity.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

Figure 4:
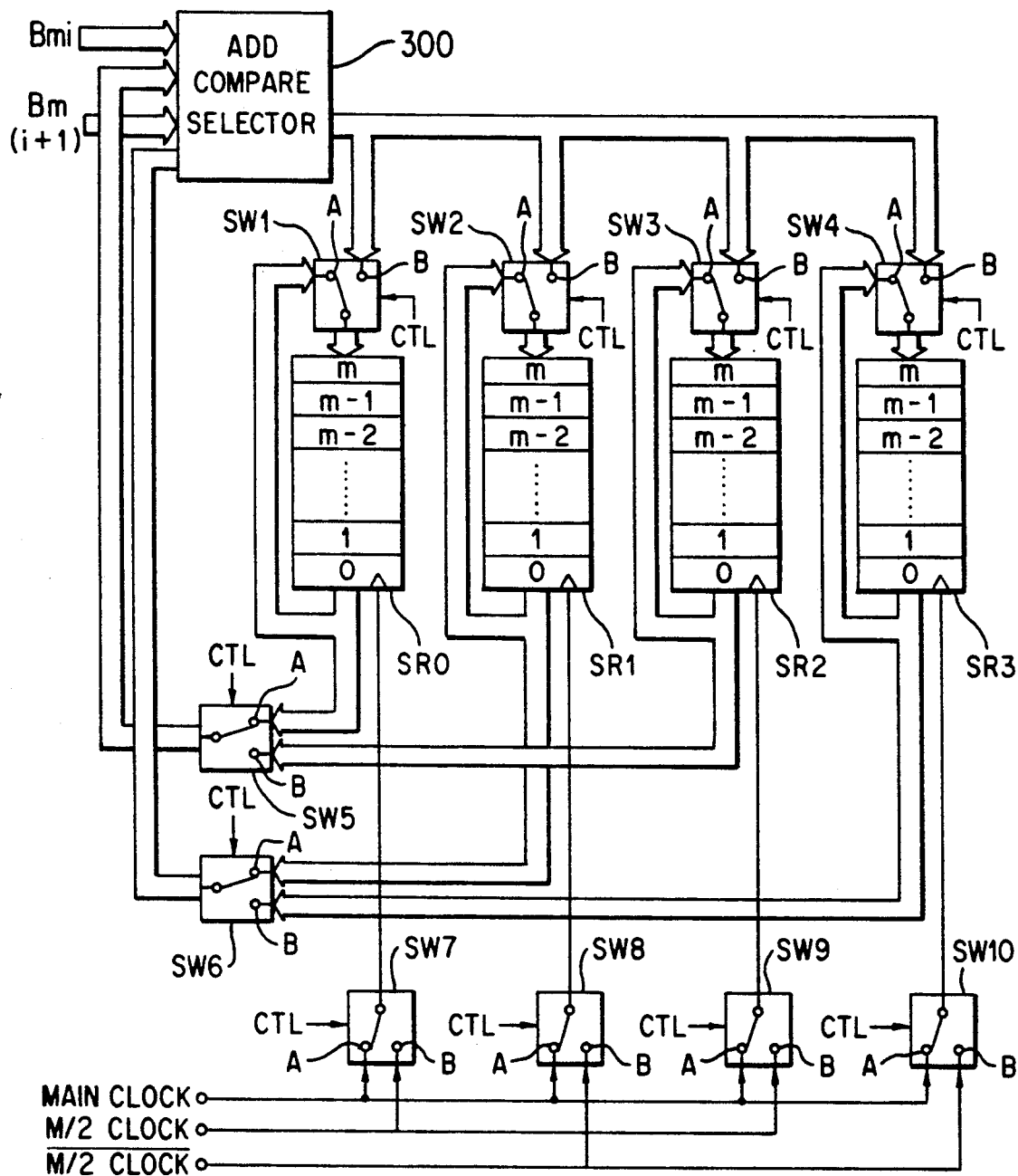
FIG. 4 illustrates a state metric quantity memory of the present invention.

As exemplified in detail in FIG. 4, the state metric quantity memory of the present invention is constructed with an encode ratio of $R = \frac{1}{2}$ and a constraint length of $K = 3$. As the values of K and R vary, the length of delay circuits and the number of switches change regularly by the values of K and R so explanations of their variances are omitted.

The first, second, third and fourth delay circuits SR0, SR1, SR2 and SR3 are utilized as means of storing the state metric quantity transmitted from add compare selector 300, and are constructed such that the total possible delay length of each delay circuit is set by a value S/B (2 in this case) which is obtained by dividing a number of possible states ($S = 2^{k-1}$) at a encode point by a number of branches ($B = 2^{n-1}$) inputted to each state according to the encode ratio.

At this time, encode ratio is $R = k/n$, where n is the number of output bits and k is the number of information bits.

The first, second, third and fourth switches SW1, SW2, SW3 and SW4 are set to the input side of the first, second, third and fourth delay circuits SR0, SR1, SR2 and SR3 and are set at position A in the initial state so that the output signal of the first and second delay circuits SR0 and SR1 is fed back into the circuits SR0 and SR1, and the third and fourth delay circuits SR2 and SR3 are supplied with the output signal of add compare selector 300. The fifth and sixth switches SW5 and SW6 are set to the output side of the first, second, third and fourth delay circuits SR0, SR1, SR2 and SR3 so that in the initial state, the output signals of the first and second delay circuits SR0 and SR1 are fed into add compare selector 300 as a previous state metric quantity. The seventh, eighth, ninth and tenth switches SW7, SW8, SW9 and SW10 supply clock signals for data transfer to the first, second, third and fourth delay circuits SR0, SR1, SR2 and SR3 so that in the initial state, a basic state metric quantity calculating clock INPUT CLOCK is supplied to the first and second delay circuits SR0 and SR1 to carry out the data transfer, and clock signals M/2 CLOCK and $\overline{M/2}$ CLOCK in which a main clock MAIN CLOCK is divided into the number of branches B are supplied to the third and fourth delay circuits SR2 and SR3 sequentially according to the main clock.

At this time, if every state metric quantity is calculated at one decode point and a change of data to a next decode point occurs, that is, when next data is inputted, a control signal CTL is fed into every switch so that the position of the switches change to the next positions (A→B and B→A).

Figure 1:
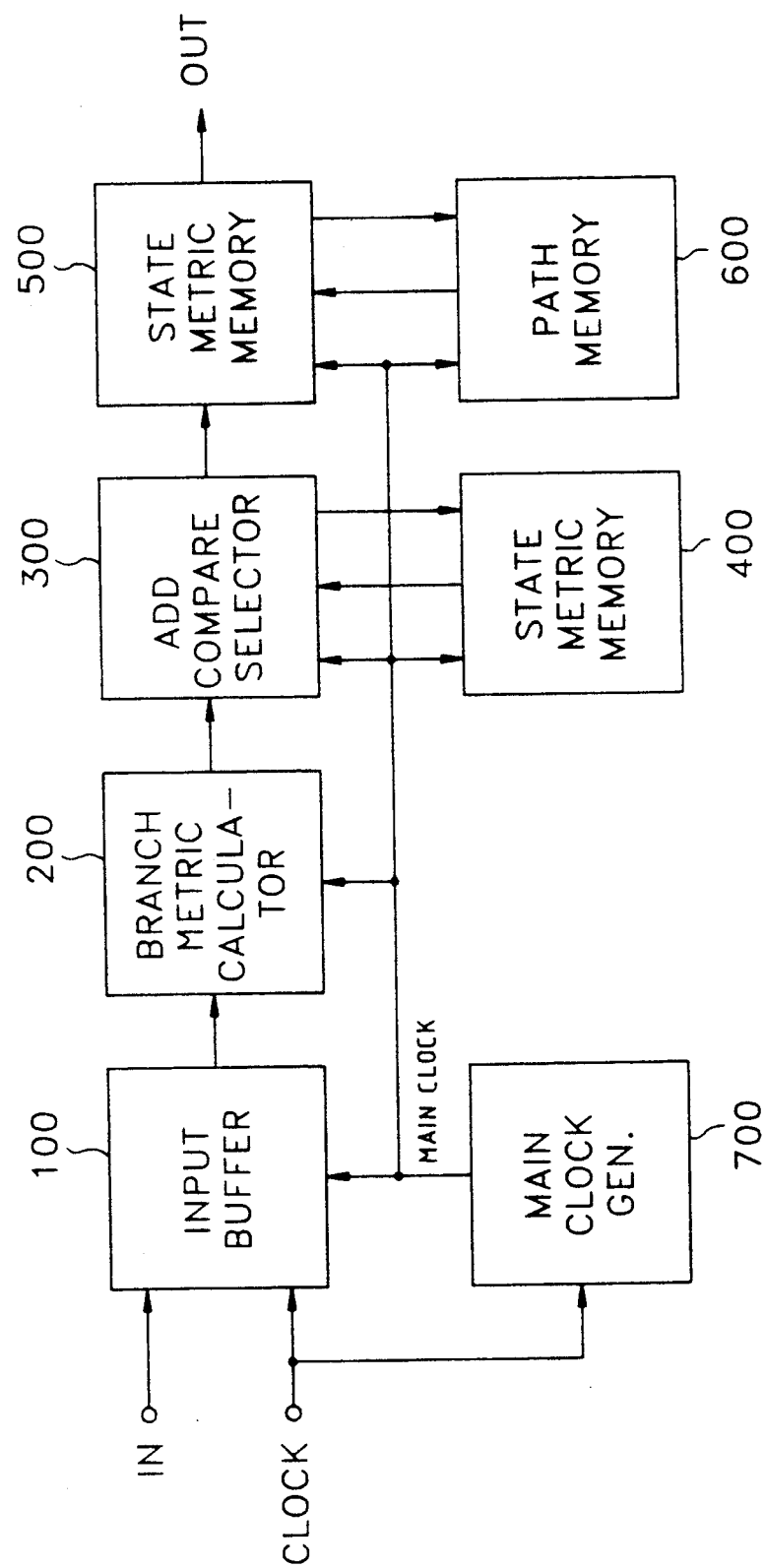
FIG. 1 is a block diagram of a conventional viterbi decoder.
Figure 2:
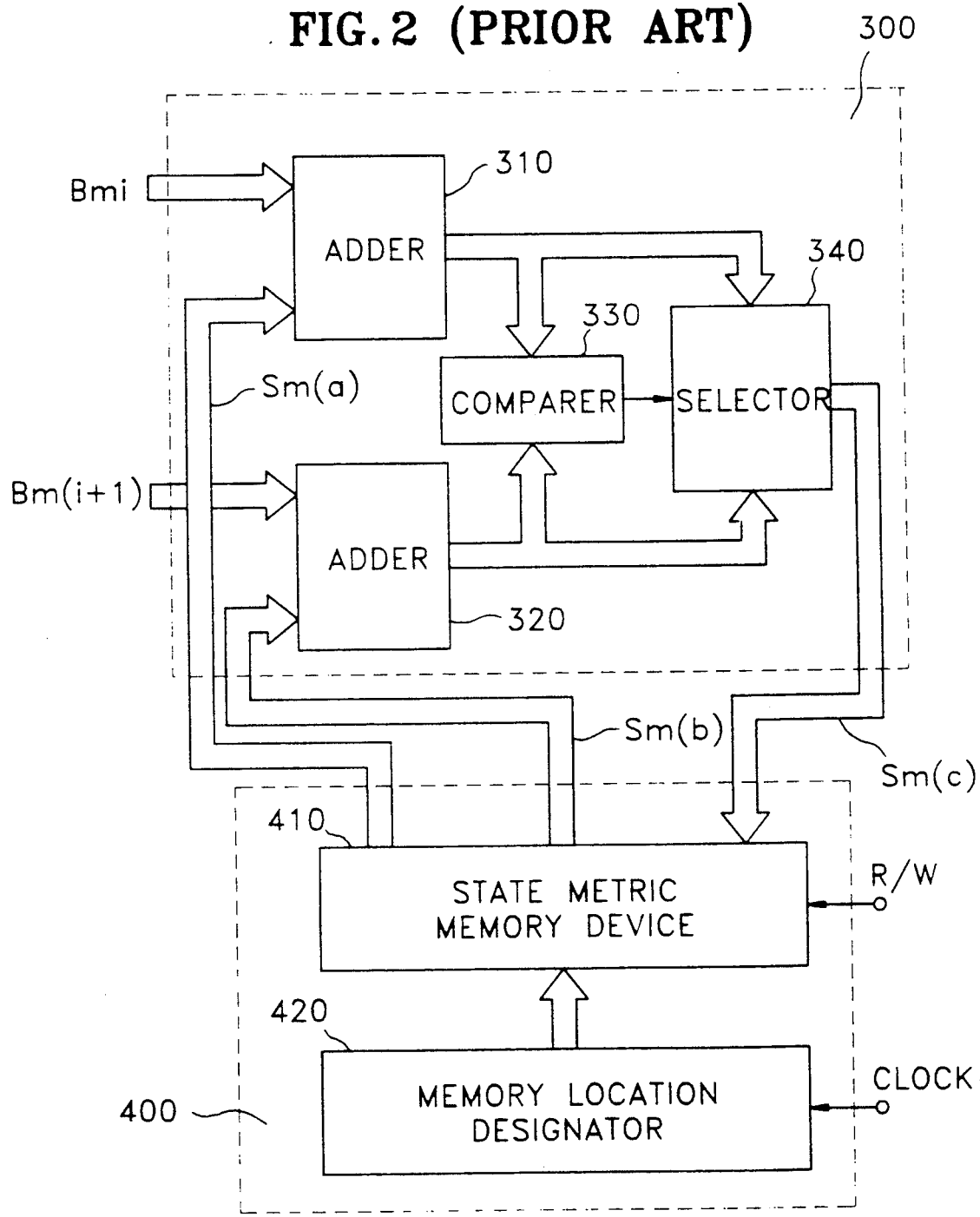
FIG. 2 illustrates in detail and add compare selector and state metric quantity memory adopted in the viterbi decoder shown in FIG. 1.
Figure 3:
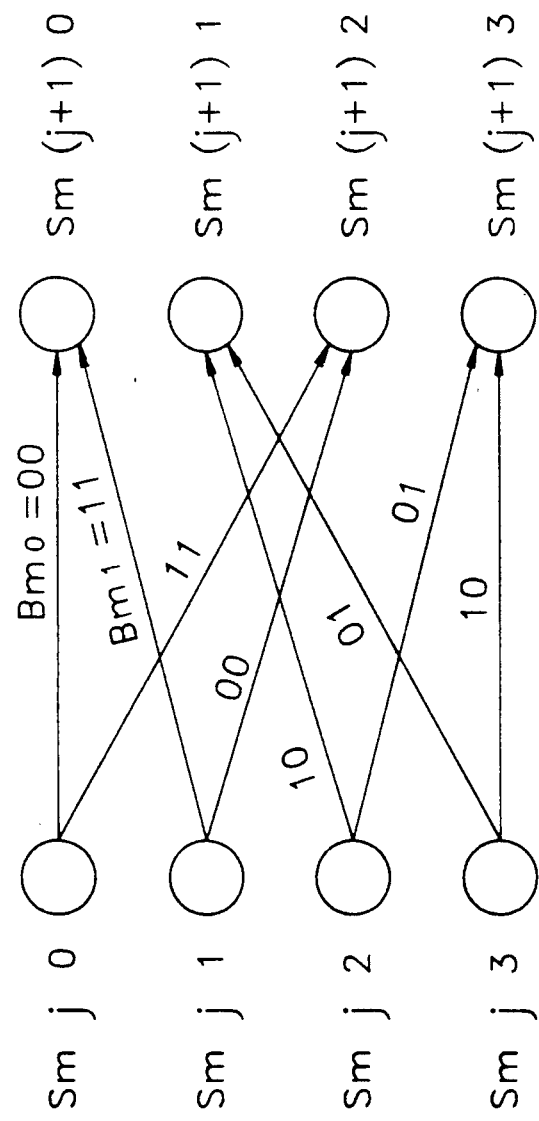
FIG. 3 is a trellis diagram when the encoding ratio is $R = \frac{1}{2}$ and the constraint length is $K = 3$ in an ordinary viterbi decoder.
Figure 5:
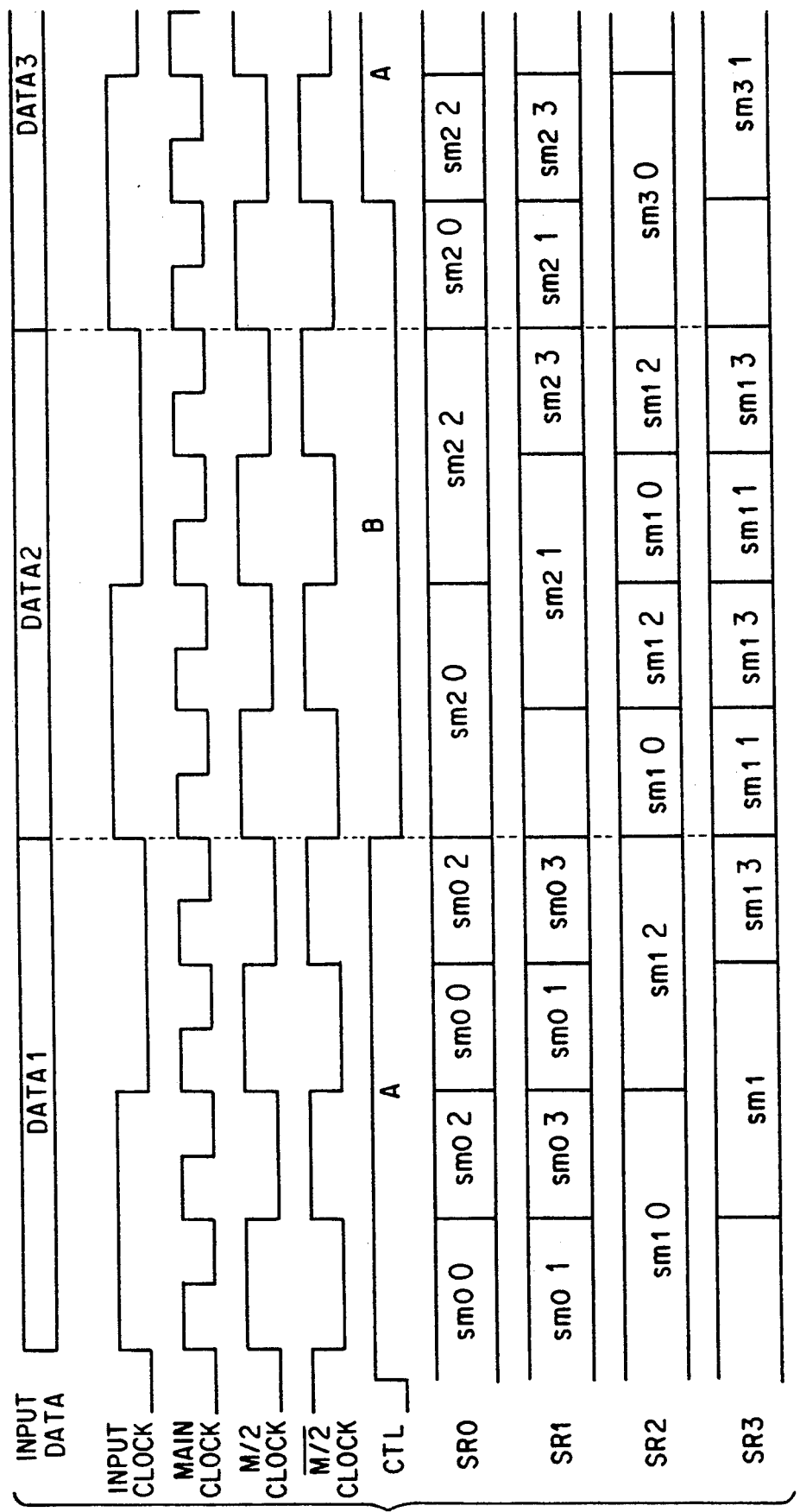
FIG. 5 is waveforms illustrating the operation of the present state metric quantity memory shown in FIG. 4 when the encoding ratio is $R = \frac{1}{2}$ and the constraint length is $K = 3$.

A more detailed description of the present invention follows referring to FIGS. 3, 4 and 5.

Generally, a viterbi decoder having the length constraint $k = 3$ should calculate the number of states $2^{k-1} = 4$. Then, supposing that one state metric quantity Sm is calculated for every main clock MAIN CLOCK for convenience of explanation, is required a main clock MAIN CLOCK having the same phase as that of the input data clock signal shown in FIG. 5 and a period four times that of the input data clock signal. In FIG. 5, the M/2 clock signal is obtained by dividing the main clock by the number of branches B in order to separately memorize state metric quantities. Here B is set to be 2 and thus the main clock is two-divided. $\overline{M/2}$ clock signal is obtained by inverting the M/2 clock signal.

The control signal CTL for controlling the positions of all switches in FIG. 4 is used by two-dividing an input clock signal INPUT CLOCK, which is switched to be contact position A when the control signal is "HIGH", is switched to contact position B when the signal is "LOW", and is at contact position A at the time point when data 1 DATA 1 of input data INPUT DATA is entered.

Accordingly, as two previous state metric quantities are required when encoder ratio R is $\frac{1}{2}$, in order to calculate a state metric quantity at a certain time point as shown in FIG. 3 when all switches are positioned at contact A at a certain time point $j + 1$, the first and second delay circuits SR0 and SR1 supply state metric quantity Sm stored at the time point j of the previous state to add compare selector 300. Then, the state metric quantities Sm are utilized to calculate state metric quantity Sm at a current time point $j + 1$ and are simultaneously fed again back into its own delay circuit to be stored. In such a case as shown in FIG. 3, Smj0 and Smj1 are required to calculate not only $Sm_{(j+1)}0$ but also $Sm_{(j+1)}2$.

State metric quantities Sm at the current time point $j + 1$ calculated in add compare selector 300 are stored in the third and fourth delay circuits SR2 and SR3, the values of Sm0 and Sm2 are inputted to third delay circuit SR2 and Sm1 and Sm3 are inputted to fourth delay circuit SR3, respectively. The reason why the calculated state metric quantities are separately stored is that as state metric quantity at the current time point becomes a previous state metric quantity when a time point changes to the next time point, and when the previous state metric quantity is supplied to add compare selector 300, Sm0 and Sm1 should be supplied simultaneously during one main clock MAIN CLOCK, and Sm2 and Sm3 should also be supplied simultaneously during one main clock.

Meanwhile, the current position of all switches are changed to B when the state metric quantity is calculated at the next time point $j+2$ after all state metric quantities have been calculated at the current time point. Thus, the values of state metric quantities of the third and fourth delay circuits SR2 and SR3 stored in memory at the time point $j+1$ become the previous state metric quantities which are inputted to add compare selector 300 by two according to the main clock MAIN CLOCK, and the calculated metric quantities are sequentially and separately stored in the first and second delay circuits SR0 and SR1. The above described operations are repeated. In addition, since the state metric quantities at the time point j stored in the first and second delay circuits SR0 and SR1 are unnecessary at time point $j+2$, it would be no matter if state metric quantities calculated at time point $j+2$ are stored in the first and second delay circuits SR0 and SR1.

During the main clock MAIN CLOCK, the previous state metric quantities $Sm_00$ and $Sm_01$ stored in the first and second delay circuits SR0 and SR1 are supplied to add compare selector 300 and simultaneously are fed back into its own delay circuit through the first and second switches SW1 and SW2. At this time, the calculated state metric quantity $Sm_10$ is stored to third delay circuit SR2 during the HIGH state period of the M/2 clock M/2 CLOCK.

During the second period of the main clock MAIN CLOCK the first and second delay circuits SR0, SR1 output $Sm_02$ and $Sm_03$, respectively, and state metric quantity $Sm_11$ calculated in add compare selector 300 is stored in the fourth delay circuit SR3 during the presence of the M/2 clock M/2 CLOCK.

During the third period of the main clock MAIN CLOCK, the output signals $Sm_00$ and $Sm_11$ which were fed back into the first and second delay circuits SR0 and SR1 for a duration of the first period of the main clock MAIN CLOCK, are outputted again to be supplied to add compare selector 300, to calculate a new state metric quantity $Sm_12$ by a different branch metric quantity Bm, and then the new state metric quantity are stored in the second delay circuit SR2.

During the fourth period of main clock MAIN CLOCK, the output signals $Sm_02$ and $Sm_03$ fed back into the first and second delay circuits SR0 and SR1 during the second period of main clock MAIN CLOCK are outputted again to be supplied to add compare selector 300, to calculate a new state metric quantity $Sm_13$ by a different branch metric quantity, which is then stored in the fourth delay circuit SR3. The calculation of all state metric quantities at the current time point is completed when the four periods of main clock are finished.

If data 2 DATA2 is inputted through input buffer 100, switches SW3 and SW4 are switched to B, the state metric quantities which was calculated when data 1 DATA1 was inputted, becomes a previous state metric quantity, then the values stored in the third and fourth delay circuits SR2 and SR3 are supplied to add compare selector 300, and then state metric quantities $Sm_20$, $Sm_21$, $Sm_22$ and $Sm_23$ calculated in the selector are stored in SR0 and SR1 during four periods of the main clock, respectively, in the same manner as in the procedure for the data DATA 1.

Then, when data 3 DATA3 is inputted, switches SW3 and SW4 are again switched to A and the same procedure as one for the above data 1 DATA 1 is repeated.

As described above, the present invention depends on a basic state metric quantity calculation clock by dividing delay devices, sequentially writing in state metric quantities, and sequentially reading them out, thereby, reducing delay time and enabling high speed processing of data.

What is claimed is:

1. In a viterbi decoder including an input buffer, a branch metric calculator, an add compare selector, a path trace-back logic circuit, a state metric quantity memory, a path memory and a main clock generator, said state metric quantity memory comprising:

first delay means for storing a previous state of the state metric quantity transmitted from said add compare selector;

second delay means for storing the current state metric quantity transmitted from said add compare selector;

first switching means which operates to make said first delay means store the current state metric quantity at the time point when the next data are inputted;

second switching means which operates to make said second delay means store the previous state metric quantity at the time point when the next data is input;

third switching means for connecting the output signals of said first and second delay means used as a previous state metric quantities to the input terminal of said add compare selector according to the time point variation; and fourth switching means for sequentially supplying a clock signal having a basic period to said first and second delay means to store each state metric quantity.

2. A state metric quantity memory as claimed in claim 1, wherein said first and second delay means are constructed such that the total possible delay length of each of said first and second means is set by a value S/B which is obtained by dividing a number of possible states ($S=2^{k-1}$) at a decode point by a number of branches ($B=2^{n-1}$) inputted to one state.

3. A state metric quantity memory as claimed in claim 1, wherein said first and second delay means are constructed such that the total number of each of said first and second delay means is set to two times the number of branches B reaching a state at a time point, the half of said total number being used to store a previous state metric quantity and the other half being used to store the current state metric quantity.

4. A state metric memory as claimed in claim 1, wherein said first and second delay means are constructed such that movement operation clocks M/2 CLOCK and $\overline{M/2}$ CLOCK are supplied to said first and second delay means sequentially according to the main clock, whereby calculated metric quantities are separately stored in each delay circuit.

* * * * *